US012812987B2

(12) United States Patent
Tai et al.

(10) Patent No.: US 12,812,987 B2
(45) Date of Patent: Nov. 24, 2026

(54) LIGHT SENSING TRANSISTOR

(71) Applicant: Novatek Microelectronics Corp., Hsinchu (TW)

(72) Inventors: Ya-Hsiang Tai, Miaoli County (TW); Yi-Cheng Yuan, New Taipei City (TW); Chen-Yu Lin, Taichung City (TW)

(73) Assignee: Novatek Microelectronics Corp., Hsinchu (TW)

( * ) Notice: Subject to any disclaimer, the term of this patent is extended or adjusted under 35 U.S.C. 154(b) by 391 days.

(21) Appl. No.: 18/346,785

(22) Filed: Jul. 4, 2023

(65) Prior Publication Data

US 2024/0290903 A1 Aug. 29, 2024

Related U.S. Application Data

(60) Provisional application No. 63/449,036, filed on Feb. 28, 2023.

(51) Int. Cl.
*H10F 30/28* (2025.01)
*H10F 77/20* (2025.01)

(52) U.S. Cl.
CPC ....... *H10F 30/2877* (2025.01); *H10F 77/206* (2025.01)

(58) Field of Classification Search
CPC .... H10F 30/2877; H10F 30/282; H10F 30/28; H10F 77/206; H10F 77/413
See application file for complete search history.

(56) References Cited

U.S. PATENT DOCUMENTS 11,056,608 B2 7/2021 Huang
2002/0084504 A1* 7/2002 Narayan ................ H10K 30/65 438/309
2003/0057507 A1* 3/2003 Bozso ................. H10F 30/2275 257/E31.066
2007/0257256 A1 11/2007 Kugler
2012/0018719 A1 1/2012 Zan et al.
2015/0262531 A1* 9/2015 Mazhari ............... H10K 59/125 345/80
2017/0104123 A1 4/2017 Ma et al.
2018/0129043 A1* 5/2018 Kim ...................... H10F 77/244
(Continued)

FOREIGN PATENT DOCUMENTS

CN 101068040 11/2007
CN 107831523 A * 3/2018 ............. G01T 1/247
(Continued)

OTHER PUBLICATIONS

Kwok K. Ng, "Phototransistor," in Complete Guide to Semiconductor Devices, IEEE, 2002, pp. 462-469, doi: 10.1109/9780470547205.ch59 (Year: 2002).*
(Continued)

*Primary Examiner* — Sitaramarao S Yechuri
(74) *Attorney, Agent, or Firm* — JCIPRNET

(57) ABSTRACT

A light sensing transistor is provided. The light sensing transistor includes a substrate, a metal layer, and a semiconductor layer. The metal layer and the semiconductor layer are disposed on the substrate. The metal layer has a first metal structure and a second metal structure. The first metal structure and the second metal structure are in direct contact with the semiconductor layer.

9 Claims, 6 Drawing Sheets

(56) References Cited

U.S. PATENT DOCUMENTS

| | | | | |
|---|---|---|---|---|
| 2018/0329084 | A1* | 11/2018 | Karim | G01T 1/247 |
| 2020/0295077 | A1 | 9/2020 | Huang | |
| 2022/0390623 | A1* | 12/2022 | Shang | G01N 23/04 |
| 2023/0366739 | A1* | 11/2023 | Chang | G01J 5/20 |

FOREIGN PATENT DOCUMENTS

| | | |
|---|---|---|
| CN | 113764533 | 12/2021 |
| TW | 201205846 | 2/2012 |

OTHER PUBLICATIONS

"Office Action of Taiwan Counterpart Application", issued on May 30, 2024, p. 1-p. 8.

* cited by examiner

LIGHT SENSING TRANSISTOR

CROSS-REFERENCE TO RELATED APPLICATION

This application claims priority to U.S. Provisional Application No. 63/449,036 entitled "EMBEDDED AMBIENT LIGHT AND COLOR TEMPERATURE SENSOR USING HIGH PHOTOCURRENT DEVICES" filed on Feb. 28, 2023, of which the entire disclosure is hereby incorporated by reference in its entirety.

BACKGROUND

1. Technical Field

The disclosure generally relates to a transistor, in particular, to a light sensing transistor.

2. Description of Related Art

For light sensing devices, light sensitivity is a critical parameter when it comes to evaluating performance of a light sensing device. Thus, how to improve light sensitivity based on current thin film transistor (TFT) manufacturing process becomes an important consideration when designing the light sensing devices.

SUMMARY

Accordingly, the disclosure is directed to a transistor, and more particularly to a light sensing transistor.

The light sensing transistor of the disclosure includes a substrate, a metal layer, and a semiconductor layer. The metal layer has a first metal structure and a second metal structure. The semiconductor layer is disposed on the metal layer. Both of the first metal structure and the second metal structure are in direct contact with the semiconductor layer.

The light sensing transistor of the disclosure includes a substrate, a semiconductor layer, and a metal layer. The semiconductor layer is disposed on the substrate. The metal layer is disposed on the semiconductor layer. The metal layer has a first metal structure and a second metal structure. Both of the first metal structure and the second metal structure are in direct contact with the semiconductor layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

For light sensing devices, light sensitivity is a critical parameter when it comes to evaluating a performance of a light sensing device. In order to achieve better light sensitivity and sensing quality, n-plus material is usually disposed between metal terminal (such as a source or drain terminal of a thin film transistor (TFT)) and a semiconductor layer of the light sensing device. However, the process of doping n-plus material is incompatible to the manufacturing process for low temperature poly-silicon (LTPS).

Figure 1:
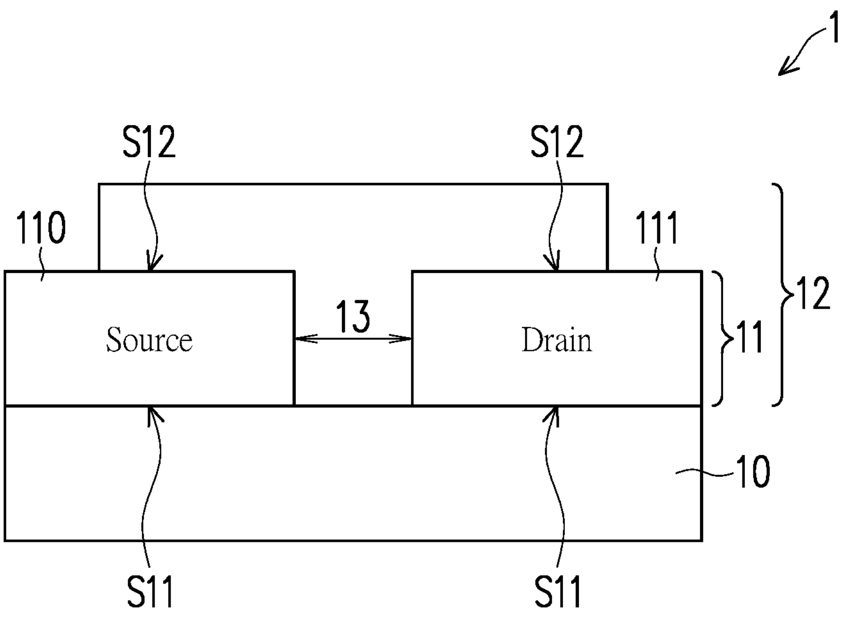
FIG. 1 illustrates a cross-sectional view of a light sensing transistor in accordance with some embodiments.

FIG. 1 illustrates a cross-sectional view of a light sensing transistor 1 in accordance with some embodiments. The light sensing transistor 1 may be a thin film transistor. The light sensing transistor 1 includes a substrate 10, a metal layer 11, and a semiconductor layer 12. The metal layer 11 is disposed on the substrate 10. The metal layer includes a first metal structure 110 and a second metal structure 111. The semiconductor layer 12 is disposed on the metal layer 11. The first metal structure 110 and the second metal structure 111 are in direct contact with the semiconductor layer 12. More specifically, the metal layer 11 are in direct contact with the semiconductor layer 12 without an intermediating n-plus layer, such that the light sensing transistor 1 has a better compatibility to different manufacturing processes.

For example, the semiconductor layer 11 is deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto. For example, an exemplary material of the semiconductor layer 12 comprises silicon nitride (SiNx), silicon oxide (SiOx), silicon oxynitride (SiNxOy) or other suitable materials. For example, materials of the first metal structure 110 and the second metal structure 111 include, but not limited to, molybdenum (Mo), or titanium (Ti) or other suitable materials.

Specifically, the metal layer 11 is disposed on the substrate 10. The metal layer 11 includes the first metal structure 110 and the second metal structure 111 respectively disposed on both sides of the light sensing transistor 1. The semiconductor layer 12 is disposed on the metal layer 11. The semiconductor layer 12 covers or encapsulates all or part of the first and second metal structures 110, 111. Since there are no n-plus layer disposed between the metal layer 11 and the semiconductor layer 12, the first metal structure 110 and the second metal structure 111 are in direct contact with the semiconductor layer 12. Specifically, the metal layer 11 has a first surface S11 and a second surface S12. The first surface S11 is between the substrate 10 and the metal layer 11 and the second surface S12 is between the metal layer 11 and the semiconductor layer 12. The first metal structure 110 and the second metal structure 111 are in direct contact with the semiconductor layer 12 on the second surface S12.

In some embodiments, the incident light is sensed by the junction interface of the second surface S12 between the metal layer 11 and the semiconductor layer 12. Light induced barrier lowering (LIBL) is formed on the junction interface of the second surface S12, which occurs when the incident light is emitted on the junction interface between the semiconductor material and metal. LIBL causes barrier on the junction interface to be lowered, thereby improving sensitivity to incident light.

Further, the first metal structure 110 and the second metal structure 111 are spaced apart by a distance on the substrate 10, so when the semiconductor layer 12 is disposed on metal layer 11, the semiconductor layer 12 not only covers on top of the metal structure 110, 111, but also part of the semiconductor layer 12 extends and fills in a spacing between the first metal structure 110 and the second metal structure 111 on the substrate 10. Thus, a tunnel region 13 is formed between the first metal structure 110 and the second metal structure 111, and provides a current path between the first metal structure 110 and the second metal structure 111.

In operation, the first and second metal structures 110, 111 may respectively function as a source and drain terminals of a transistor. A sensing current may be excited and flowing between the first and second metal structures 110, 111 through the tunnel region 13 when a light is emitted from a top side to the light sensing transistor 1. The light received by the first and second metal structures 110, 111 excites the sensing current, thereby realizing a light sensing function of the light sensing transistor 1.

Figure 2A:
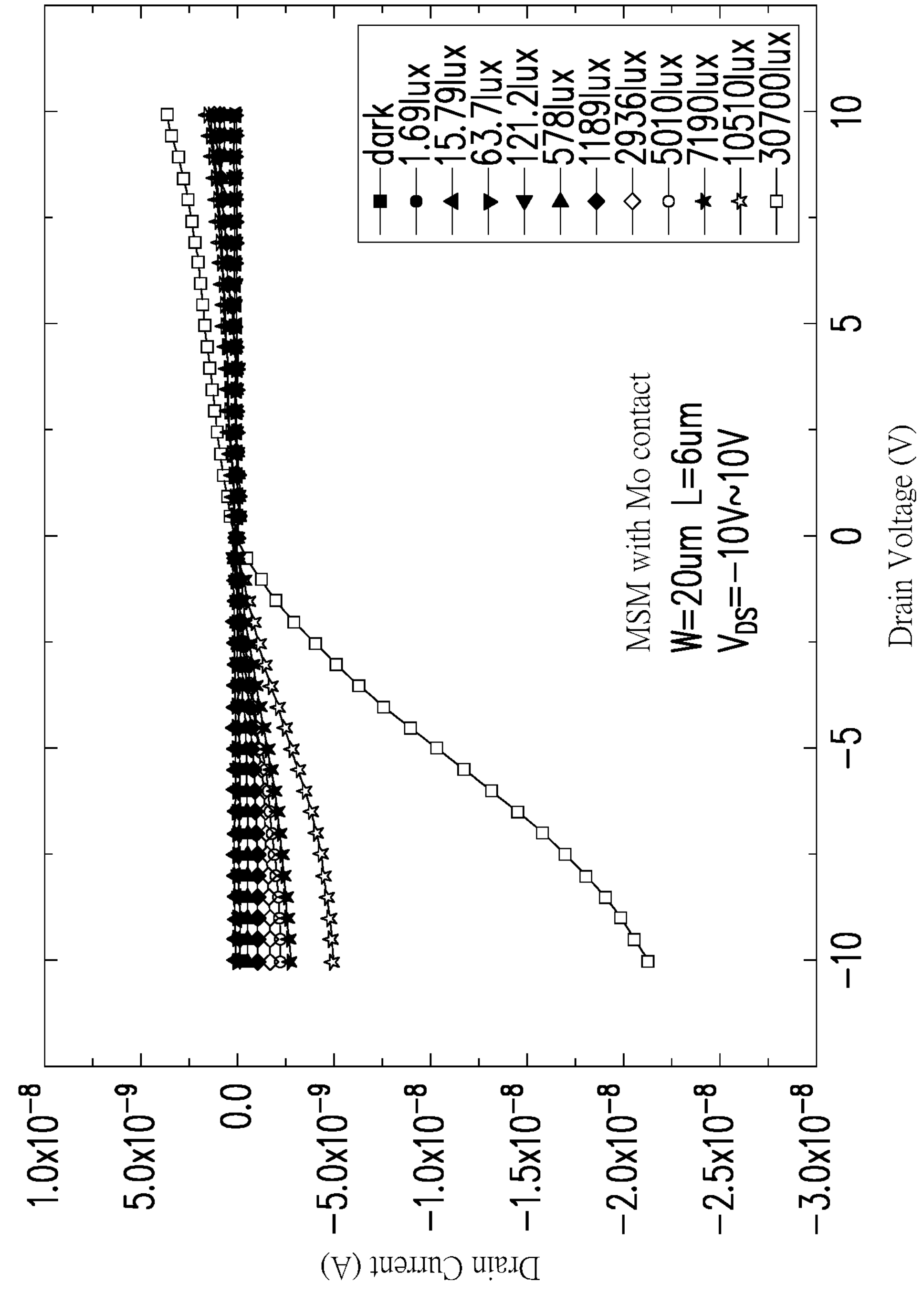
FIG. 2A illustrates relationship curves of sensing currents driven by the light sensing transistor in FIG. 1 in accordance with some embodiments.

FIG. 2A illustrates relationship curves of sensing currents driven by the light sensing transistor 1 in FIG. 1 in accordance with some embodiments. A vertical axis and a horizontal axis in FIG. 2A respectively correspond to drain currents flowing through the light sensing transistor 1 and drain voltages applied to the light sensing transistor 1. The relationship curves in FIG. 2A are respectively generated by the light sensing transistor 1 according to different intensity of incident lights. As can be seen in FIG. 2A, the drain current flowing through the light sensing transistor 1 increases as the applied drain voltage increases. Further, as the intensity of the incident light to the light sensing transistor 1 increases, the slope of the relationship curve becomes steeper, which causes a lower drain current at a negative drain voltage and a larger drain current at a positive drain voltage. Thus, it is demonstrated in FIG. 2A that the sensing current generated by the light sensing transistor 1 encompasses high linearity and high sensitivity to the incident light.

Figure 2B:
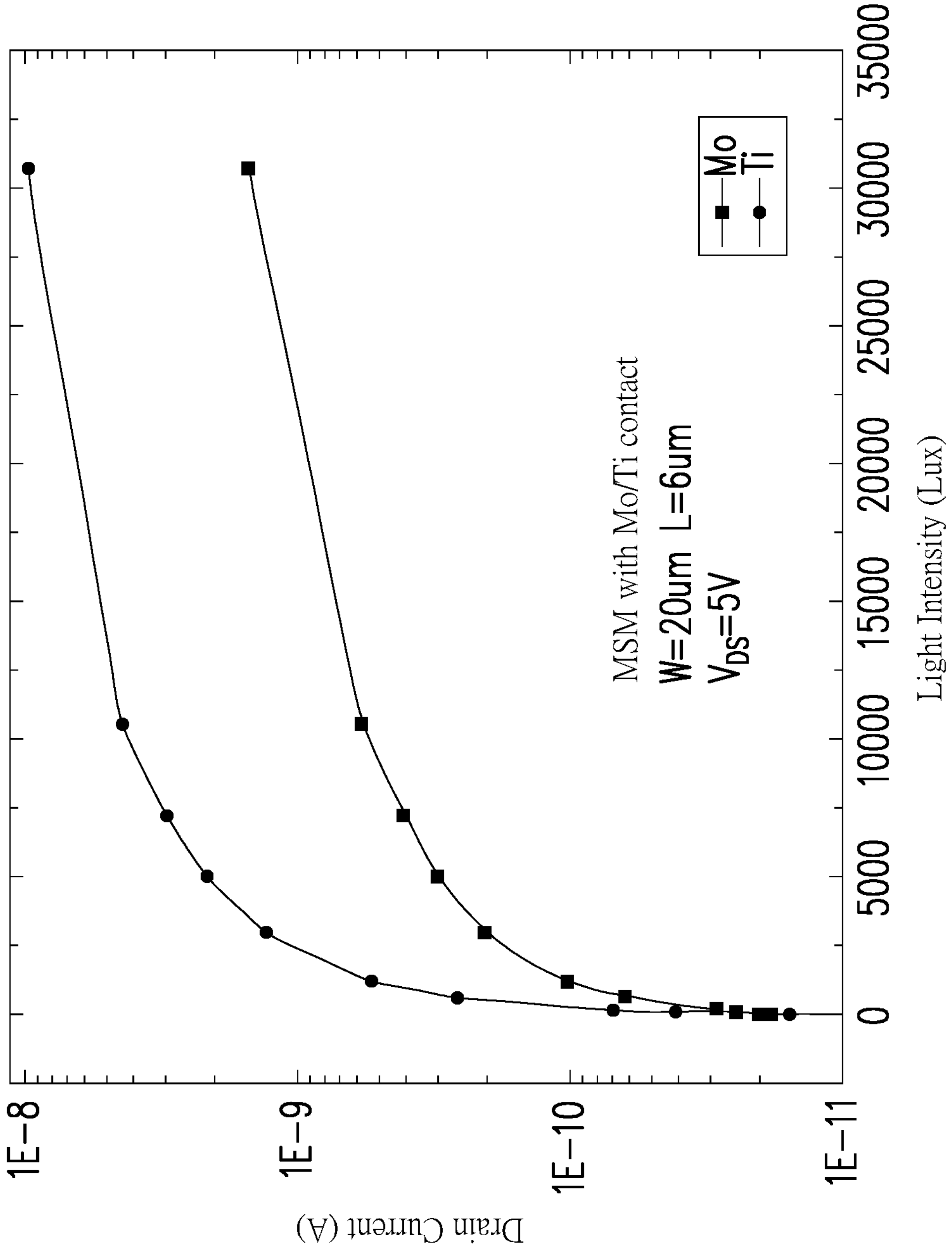
FIG. 2B illustrates relationship curves of sensing currents driven by the light sensing transistor in FIG. 1 in accordance with some embodiments.

FIG. 2B illustrates relationship curves of sensing currents driven by the light sensing transistor 1 in FIG. 1 in accordance with some embodiments. A vertical axis and a horizontal axis in FIG. 2B respectively correspond to drain currents flowing through the light sensing transistor 1 and intensity of light emitted on the light sensing transistor 1. The relationship curves in FIG. 2B are the drain currents generated by the light sensing transistor 1 with the first and second metal structures 110, 111 being made of different materials. Specifically, the first and second metal structures 110, 111 may include the materials, such as titanium or molybdenum. As can be seen in FIG. 2B, the light sensing transistor 1 with the first and second metal structures 110, 111 being made of the titanium generates a higher drain current than that generated by the light sensing transistor 1 with the first and second metal structures 110, 111 being made of the molybdenum. Such difference occurred on the drain currents driven by the light sensing transistor 1 is reflected from different values of work functions of titanium and molybdenum.

Figure 3:
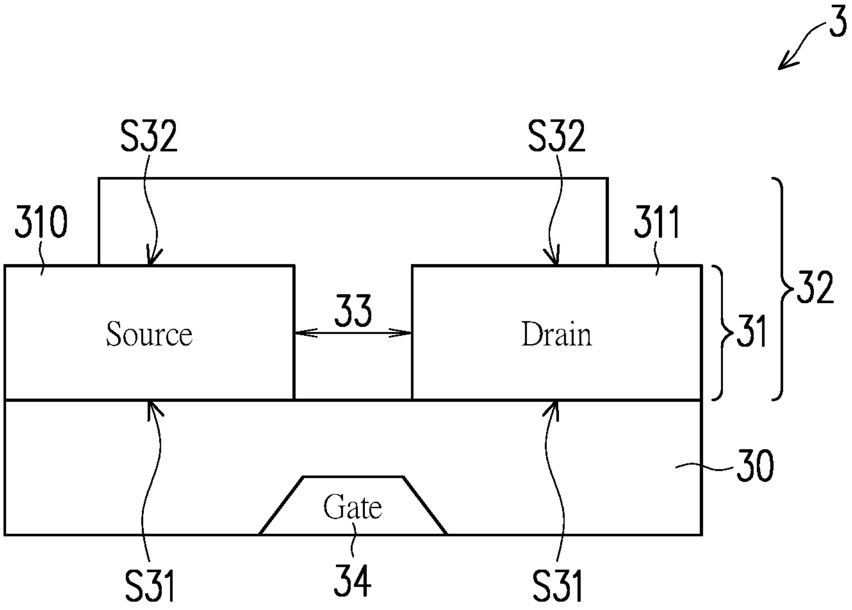
FIG. 3 illustrates a cross-sectional view of a light sensing transistor in accordance with some embodiments.

FIG. 3 illustrates a cross-sectional view of a light sensing transistor 3 in accordance with some embodiments. The light sensing transistor 3 may be a thin film transistor (TFT). The light sensing transistor 3 includes a substrate 30, a metal layer 31, a semiconductor layer 32, and a gate structure 34. The substrate 30 is disposed on the gate structure 34. The metal layer 31 is disposed on the substrate 30. The metal layer 31 includes a first metal structure 310 and a second metal structure 311. The semiconductor layer 32 is disposed on the metal layer 31. The gate structure 34 and the metal layer 31 are disposed on opposite sides of the substrate 30. The first metal structure 310 and the second metal structure 311 are in direct contact with the semiconductor layer 32. More specifically, the metal layer 31 are in direct contact with the semiconductor layer 32 without an intermediating n-plus layer, such that the light sensing transistor 3 may possess a better compatibility to different manufacturing processes. Further, the gate structure 34 is disposed on the back side of the substrate 30 may be utilized for shielding the incident light from the back side of the light sensing transistor 3, thereby reducing interference resulted from the incident light from the back side of the light sensing transistor 3.

For example, the semiconductor layer 31 is deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto. For example, an exemplary material of the semiconductor layer 32 comprises silicon nitride (SiNx), silicon oxide (SiOx), silicon oxynitride (SiNxOy) or other suitable materials. For example, materials of the first metal structure 310 and the second metal structure 311 include, but not limited to, molybdenum (Mo), or titanium (Ti) or other suitable materials.

Further, the metal layer 31 is disposed on the substrate 30. The metal layer 31 includes the first metal structure 310 and the second metal structure 311 respectively disposed on left and right sides of the light sensing transistor 3. The semiconductor layer 32 is disposed on the metal layer 31. The semiconductor layer 32 covers all of or part of the first and second metal structures 310, 311. Since there are no other materials or layers (such as an n-plus layer) intermediated between the metal layer 31 and the semiconductor layer 32, the first metal structure 310 and the second metal structure 311 are in direct contact with the semiconductor layer 32. The first metal structure 310 and the second metal structure 311 are spaced apart on the substrate 30 by a distance, so when the semiconductor layer 32 is disposed on metal layer 31, the semiconductor layer 32 not only covers on top side of the metal structure 310, 311, but also fills in the spacing between the first metal structure 310 and the second metal structure 311 on the substrate 30. Specifically, the metal layer 31 has a first surface S31 and a second surface S32. The first surface S31 is between the substrate 30 and the metal layer 31 and the second surface S32 is between the metal layer 31 and the semiconductor layer 32. The first metal structure 310 and the second metal structure 311 are in direct contact with the semiconductor layer 32 on the second surface S32. Further, a tunnel region 33 is formed between the first metal structure 310 and the second metal structure 311, and the tunnel region 33 provides a current path between the first metal structure 310 and the second metal structure 311.

In some embodiments, the incident light is sensed by the junction interface of the second surface S32 between the metal layer 31 and the semiconductor layer 32. Light induced barrier lowering (LIBL) is formed on the junction interface of the second surface S32, which occurs when the incident light is emitted on the junction interface between the semiconductor material and metal. LIBL causes barrier on the junction interface to be lowered, thereby improving sensitivity to incident light.

Specifically, the gate structure 34 is disposed under the substrate 30, and the metal layer 31 is disposed on the substrate 30, so that the gate structure 34 and the metal layer 31 are disposed on opposite sides of the substrate 30. The gate structure 34 may be disposed on the bottom side of the substrate 30 for shielding incident light from the back side of the light sensing transistor 3. In some aspect, the gate structure 34 may be coupled to receive a gate voltage, which may be further used for biasing the light sensing transistor 3. Specifically, the sensing current flowing through the light sensing transistor 3 may be biased by the gate voltage applied to the gate structure 34 at a relatively small range according to the applied gate voltage.

The gate structure 34 is disposed under the substrate 30. The gate structure 34 disposed under the substrate 30 has a wider width than that of the tunnel region 33. The tunnel region 33 may be overlapped with the gate structure 34 in a vertical projection direction. That is, the tunnel region 33 falls within a range of the gate structure 34 from the vertical projection direction, such that the gate structure 34 may be utilized for shielding an incident light from the back side to the tunnel region 33 of the light sensing transistor 3.

In operation, the first and second metal structures 310, 311 may respectively function as a source and drain terminals of a transistor while the gate structure 34 may function as a gate terminal. In some embodiments, the light sensing transistor 3 is configured to sense the light from the top side of the light sensing transistor 3. When a light is emitted from a top side to the light sensing transistor 3, carriers on the first and second metal structures 310, 311 may be excited by the light, rendering the current flowing between the first and second metal structures 310, 311 through the tunnel region 33. Since the light incident from the back side to the tunnel region 33 of the light sensing transistor 3 may be effectively shielded by the gate structure 34, a signal to noise ratio of the light sensing transistor 3 may be effectively enhanced. Thus, by disposing the gate structure 34 on the back side of the light sensing transistor 3, the light sensing transistor 3 may effectively avoid noise aroused by the incident light from the back side to the tunnel region 33 of the light sensing transistor 3.

Figure 4:
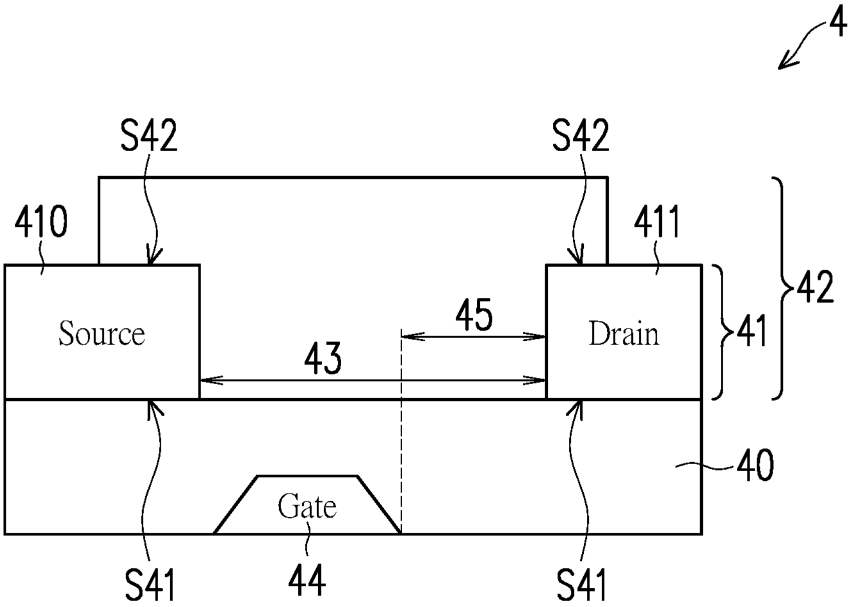
FIG. 4 illustrates a cross-sectional view of a light sensing transistor in accordance with some embodiments.

FIG. 4 illustrates a cross-sectional view of a light sensing transistor 4 in accordance with some embodiments. The light sensing transistor 4 may be a thin film transistor (TFT). The light sensing transistor 4 includes a substrate 40, a metal layer 41, a semiconductor layer 42, and a gate structure 44. The substrate 40 is disposed on the gate structure 44. The metal layer 41 is disposed on the substrate 40. The metal layer 41 includes a first metal structure 410 and a second metal structure 411. The semiconductor layer 42 is disposed on the metal layer 41. The gate structure 44 and the metal layer 41 are disposed on opposite sides of the substrate 40. The first metal structure 410 and the second metal structure 411 are in direct contact with the semiconductor layer 42. More specifically, the metal layer 41 are in direct contact with the semiconductor layer 42 without an intermediating n-plus layer, such that the light sensing transistor 4 may possess a better compatibility to different manufacturing processes. Further, the gate structure 44 is disposed on the back side for defining a gap region 45 between the gate structure 44 and the second metal structure 411 in a vertical projection direction. The gap region 45 makes the light sensing transistor 4 as a gap-type light sensing transistor 4, which usually includes, but not limited to, one or more advantages of higher sensing current and better light sensitivity, or the like.

For example, the semiconductor layer 41 is deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto. For example, an exemplary material of the semiconductor layer 52 comprises silicon nitride (SiNx), silicon oxide (SiOx), silicon oxynitride (SiNxOy) or other suitable materials. For example, materials of the first metal structure 410 and the second metal structure 411 include, but not limited to, molybdenum (Mo), or titanium (Ti) or other suitable materials.

Specifically, the metal layer 41 is disposed on the substrate 40. The metal layer 41 includes the first metal structure 410 and the second metal structure 411 respectively disposed on left and right sides of the light sensing transistor 4. The semiconductor layer 42 is disposed on the metal layer 41. The semiconductor layer 42 covers all of or part of the first and second metal structures 410, 411. Since there are no other materials or layers (such as an n-plus layer) intermediated between the metal layer 41 and the semiconductor layer 42, the first metal structure 410 and the second metal structure 411 are in direct contact with the semiconductor layer 42. The first metal structure 410 and the second metal structure 411 are spaced apart on the substrate 40 by a distance, so when the semiconductor layer 42 is disposed on metal layer 41, the semiconductor layer 42 not only covers on top side of the metal structure 410, 411, but also fills in the spacing between the first metal structure 410 and the second metal structure 411 on the substrate 40. Further, the metal layer 41 has a first surface S41 and a second surface S42. The first surface S41 is between the substrate 40 and the metal layer 41 and the second surface S42 is between the metal layer 41 and the semiconductor layer 42. The first metal structure 410 and the second metal structure 411 are in direct contact with the semiconductor layer 42 on the second surface S42.

In some embodiments, the incident light is sensed by the junction interface of the second surface S42 between the metal layer 41 and the semiconductor layer 42. Light induced barrier lowering (LIBL) is formed on the junction interface of the second surface S42, which occurs when the incident light is emitted on the junction interface between the semiconductor material and metal. LIBL causes barrier on the junction interface to be lowered, thereby improving sensitivity to incident light.

Further, a tunnel region 43 is defined by the first metal structure 410 and the second metal structure 411, and formed by the semiconductor layer 43 filled in between the first metal structure 410 and the second metal structure 411. The tunnel region 43 provides a current path between the first metal structure 410 and the second metal structure 411.

The gate structure 44 is disposed under the substrate 40, and the metal layer 41 is disposed on the substrate 40, so that the gate structure 44 and the metal layer 41 are disposed on opposite sides of the substrate 40. The gate structure 44 may be disposed on the bottom side of the substrate 40 for shielding part of incident light from the back side of the light sensing transistor 4. In some aspect, the gate structure 44 may be coupled to receive a gate voltage, which may be further used for biasing the light sensing transistor 4. Specifically, the sensing current flowing through the light sensing transistor 4 may be biased by the gate voltage applied to the gate structure 44 at a relatively small range according to the applied gate voltage.

The gate structure 44 disposed under the substrate 40 further defines the gap region 45 within the tunnel region 43. Specifically, the gate structure 44 has a narrower width than that of the tunnel region 43. The gate structure 44 may be substantially aligned to or partially overlapped with a side wall of the first metal structure 410 in the vertical projection direction. Thus, the gate structure 44 covers one side of the tunnel region 43 while leaving another side of the tunnel region 43 exposed to the incident light from the back side of the light sensing transistor 4. The exposed region within the tunnel region 43 is the gap region 45. Therefore, the gate structure 44 may be utilized for shielding part of incident light from the back side to the tunnel region 43 of the light sensing transistor 4. In some embodiments, the gap-type light sensing transistor 4 is configured to sense the light from the top side of the light sensing transistor 4 with a higher sensing current and a better light sensitivity.

Further, as mentioned before, the phenomenon of LIBL is occurred between the junction interface between the semiconductor material and metal. Therefore, LIBL is also occurred on a junction interface between a side wall of the second metal structure 411 and the gap region 45. The barrier for carriers on the junction interface is accordingly lowered, thereby enhancing a light sensitivity of the gap-type light sensing transistor 4.

In operation, the first and second metal structures 410, 411 may respectively function as a source and drain terminals of a transistor, while the gate structure 44 may be coupled to provide the gate voltage biasing the light sensing transistor 4. When a light is emitted from a top side to the light sensing transistor 4, carriers on the first and second metal structures 410, 411 may be excited by the light, rendering the current flowing between the first and second metal structures 410, 411 through the tunnel region 43. Since the light incident from the back side to the tunnel region 43 of the light sensing transistor 4 may be effectively shielded by the gate structure 44, a signal to noise ratio of the light sensing transistor 4 may be effectively enhanced.

Figure 5:
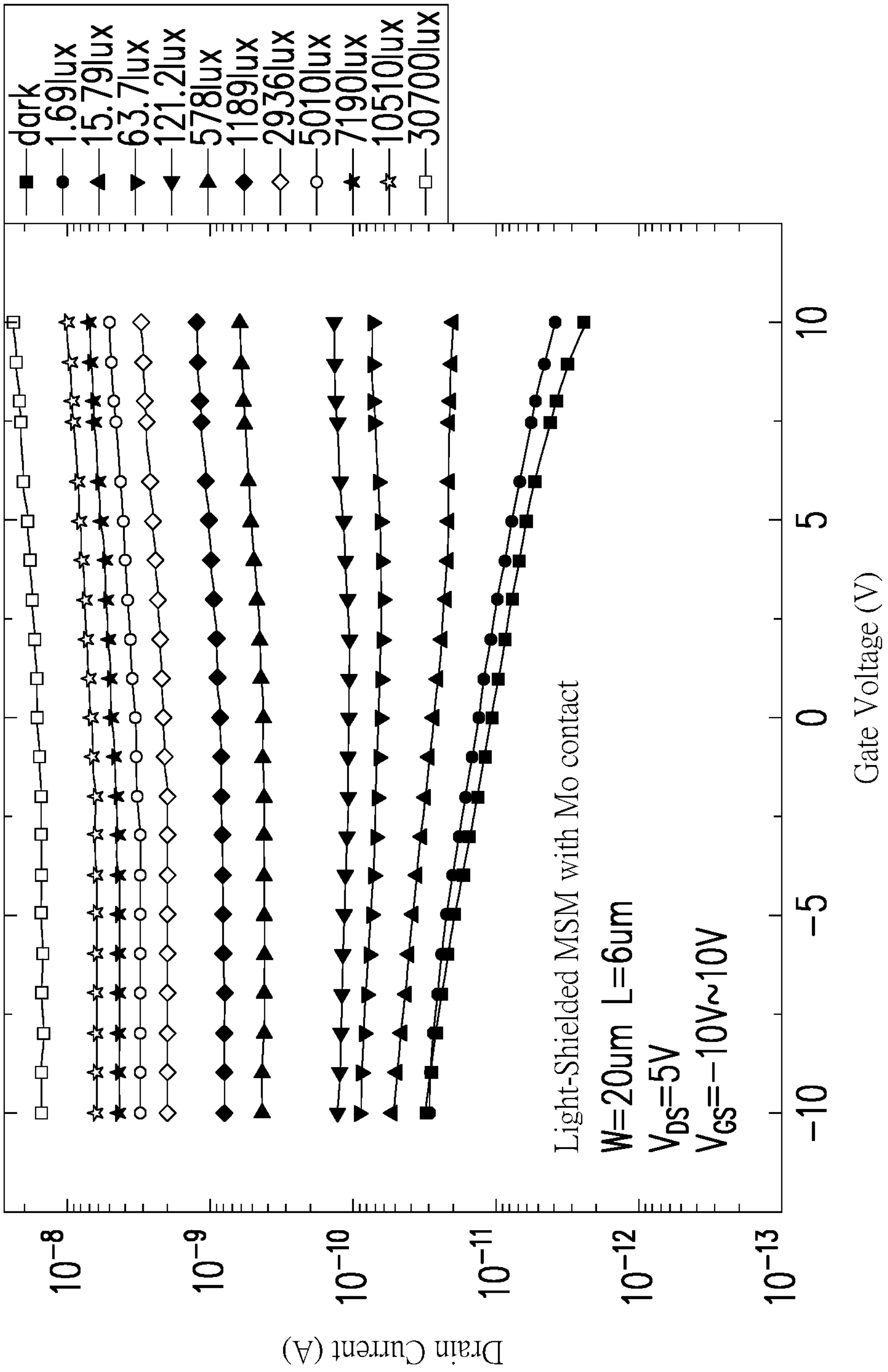
FIG. 5 illustrates relationship curves of drain currents and gate voltages of the light sensing transistor in FIG. 3 in accordance with some embodiments.

FIG. 5 illustrates relationship curves of drain currents and gate voltages of the light sensing transistor 3 in FIG. 3 in accordance with some embodiments. A vertical axis and a horizontal axis in FIG. 5 respectively correspond to drain currents flowing through the light sensing transistor 3 and gate voltages applied to the light sensing transistor 3. The relationship curves in FIG. 5 are generated by the light sensing transistor 3 when different intensity of incident light is applied. As can be seen in FIG. 5, the drain current flowing through the light sensing transistor 1 increases as the applied drain voltage increases. Particularly, FIG. 5 demonstrates a linear relationship between the sensing currents generated by the light sensing transistor 3 when the incident light of different intensity is applied. Moreover, the light sensing transistor 3 may be capable of driving the sensing current when different levels of gate voltages are applied. In some embodiments, when there is n-plus material disposed between the metal layer 31 and the semiconductor layer 32, the light sensing transistor 3 is configured to generate the sensing current when a positive gate voltage is applied. In other words, the light sensing transistor 3 is capable of sensing the incident light and generating the sensing current even when not only the positive gate voltage but also the negative gate voltage is applied to the light sensing transistor 3. Thus, the light sensing transistor 3 is capable of sensing the incident light when the gate voltage selected from a wider range is applied. Although it is contemplated that the relationship curves shown in FIG. 5 corresponds to characteristics of the light sensing transistor 3 in FIG. 3, however, the light sensing transistor 4 in FIG. 4 also shows similar characteristics. That is, the light sensing transistor 4 is also capable of sensing the incident light when the gate voltage selected from a wider range is applied.

Figure 6:
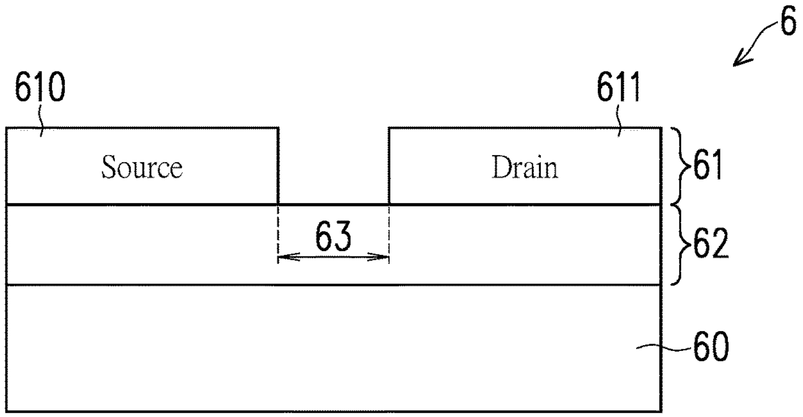
FIG. 6 illustrates a cross-sectional view of a light sensing transistor in accordance with some embodiments.

FIG. 6 illustrates a cross-sectional view of a light sensing transistor 6 in accordance with some embodiments. In brief, the light sensing transistor 6 is configured to sense incident light emitted from a back side of the light sensing transistor 6. The light sensing transistor 6 may be a thin film transistor (TFT). The light sensing transistor 6 includes a substrate 60, a metal layer 61, and a semiconductor layer 62. The semiconductor layer 62 is disposed on the substrate 60. The metal layer 61 is disposed on the semiconductor layer 62. The metal layer includes a first metal structure 610 and a second metal structure 611. The first metal structure 610 and the second metal structure 611 are in direct contact with the semiconductor layer 62. More specifically, the metal layer 61 are in direct contact with the semiconductor layer 62 without an intermediating n-plus layer, such that the light sensing transistor 6 has a better compatibility to different manufacturing processes.

For example, the semiconductor layer 61 is deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto. For example, an exemplary material of the semiconductor layer 62 comprises silicon nitride (SiNx), silicon oxide (SiOx), silicon oxynitride (SiNxOy) or other suitable materials. For example, materials of the first metal structure 610 and the second metal structure 611 include, but not limited to, molybdenum (Mo), or titanium (Ti) or other suitable materials.

Specifically, the semiconductor layer 62 is disposed on the substrate 60. The metal layer 61 is disposed on the semiconductor layer 62. The metal layer 61 includes the first metal structure 610 and the second metal structure 611 respectively disposed on both sides of the light sensing transistor 6. Particularly, there are no n-plus layer disposed between the metal layer 61 and the semiconductor layer 62, and thus the first metal structure 610 and the second metal structure 611 are in direct contact with the semiconductor layer 62.

In some embodiments, the incident light is sensed by the junction interface between the metal layer 61 and the semiconductor layer 62. A phenomenon called light induced barrier lowering (LIBL) may be formed on the junction interface, which is occurred when the incident light is emitted on a junction interface between the semiconductor material and metal. LIBL causes barrier of carriers on the junction interface to be lowered, thereby improving sensitivity of the light sensing transistor 6 to incident light.

Further, the first metal structure 610 and the second metal structure 611 are spaced apart by a distance on the substrate 60, and a tunnel region 63 is defined by the first metal structure 610, 611 and formed by the semiconductor layer 62 between and under the first metal structure 610 and the second metal structure 611. The tunnel region 63 provides a current path between the first metal structure 610 and the second metal structure 611.

In operation, the first and second metal structures 610, 611 may respectively function as a source and drain terminals of a transistor. The first metal structure 610 and the second metal structure 611 may be used for receiving the incident light from the back side. Carriers on the junction interface between the semiconductor layer 62 and the metal layer 61 may be excited on when the incident light is emitted on the first and second metal structures 610, 611*m* causing a sensing current flowing between the first and second metal structures 610, 611 through the tunnel region 63. Therefore, a light sensing function of the light sensing transistor 6 may be realized.

Figure 7:
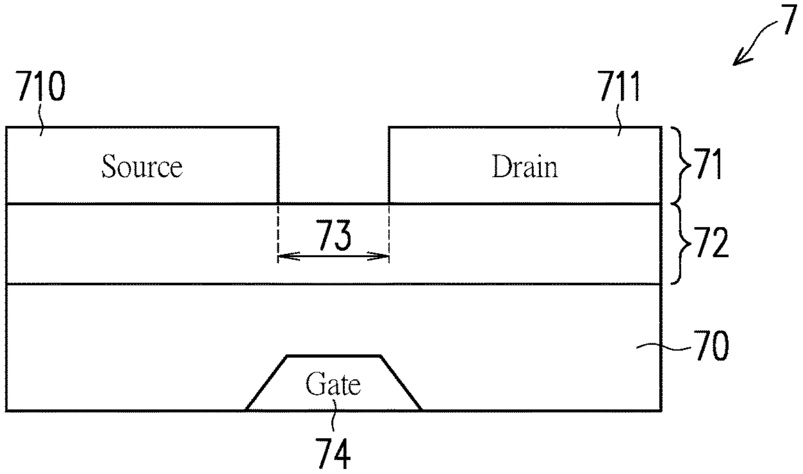
FIG. 7 illustrates a cross-sectional view of a light sensing transistor in accordance with some embodiments.

FIG. 7 illustrates a cross-sectional view of a light sensing transistor 7 in accordance with some embodiments. The light sensing transistor 7 may be a thin film transistor (TFT). The light sensing transistor 7 includes a substrate 70, a metal layer 71, a semiconductor layer 72, and a gate structure 74. The substrate 70 is disposed on the gate structure 74. The semiconductor layer 72 is disposed on the substrate 70. The gate structure 74 and the semiconductor layer 72 are disposed on opposite sides of the substrate 70. The metal layer 71 is disposed on the semiconductor layer 72. The metal layer 71 includes a first metal structure 710 and a second metal structure 711. The first metal structure 710 and the second metal structure 711 are in direct contact with the semiconductor layer 72. More specifically, the metal layer 71 are in direct contact with the semiconductor layer 72 without an intermediating n-plus layer, such that the light sensing transistor 7 may achieve a better compatibility to different manufacturing processes. Further, the gate structure 74 is disposed on the back side of the substrate 70 may be utilized for shielding the incident light from the back side of the light sensing transistor 7, thereby reducing interference resulted from the incident light from the back side of the light sensing transistor 7.

For example, the semiconductor layer 71 is deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto. For example, an exemplary material of the semiconductor layer 72 comprises silicon nitride (SiNx), silicon oxide (SiOx), silicon oxynitride (SiNxOy) or other suitable materials. For example, materials of the first metal structure 710 and the second metal structure 711 include, but not limited to, molybdenum (Mo), or titanium (Ti) or other suitable materials.

Specifically, the semiconductor layer 72 is disposed on the substrate 70. The metal layer 71 is disposed on the semiconductor layer 72. The metal layer 71 includes the first metal structure 710 and the second metal structure 711 respectively disposed on both sides of the light sensing transistor 7. Particularly, there are no n-plus layer disposed between the metal layer 71 and the semiconductor layer 72, and thus the first metal structure 710 and the second metal structure 711 are in direct contact with the semiconductor layer 72.

In some embodiments, the incident light is sensed by the junction interface between the metal layer 71 and the semiconductor layer 72. A phenomenon called light induced barrier lowering (LIBL) may be formed on the junction interface, which is occurred when the incident light is emitted on a junction interface between the semiconductor material and metal. LIBL causes barrier of carriers on the junction interface to be lowered, thereby improving sensitivity of the light sensing transistor 7 to incident light.

The first metal structure 710 and the second metal structure 711 are spaced apart by a distance on the substrate 70, and a tunnel region 73 is defined by the first metal structure 710, 711 and formed by the semiconductor layer 72 between and under the first metal structure 710 and the second metal structure 711. The tunnel region 73 provides a current path between the first metal structure 710 and the second metal structure 711.

Further, the gate structure 74 is disposed under the substrate 70, and the metal layer 71 is disposed on the substrate 70, so that the gate structure 74 and the metal layer 71 are disposed on opposite sides of the substrate 70. The gate structure 74 may be disposed on the bottom side of the substrate 70 for shielding incident light from the back side of the light sensing transistor 7. In some aspect, the gate structure 74 may be coupled to receive a gate voltage, which may be further used for biasing the light sensing transistor 7. Specifically, the sensing current flowing through the light sensing transistor 7 may be biased by the gate voltage applied to the gate structure 74 at a relatively small range according to the applied gate voltage.

The gate structure 74 is disposed under the substrate 70. The gate structure 74 disposed under the substrate 70 has a wider width than that of the tunnel region 73. The tunnel region 73 may be overlapped with the gate structure 74 in a vertical projection direction. That is, the tunnel region 73 falls within a range of the gate structure 74 from the vertical projection direction, such that the gate structure 74 may be utilized for shielding part of light incident from back side of the light sensing transistor 7, and more specifically to the part of light incident on the tunnel region 73 from the back side of the light sensing transistor 7.

In operation, the first and second metal structures 710, 711 may respectively function as a source and drain terminals of a transistor while the gate structure 74 may function as a gate terminal. In some embodiments, the light sensing transistor 7 is configured to sense the light from the back side of the light sensing transistor 7. When a light is emitted from a top side to the light sensing transistor 7, carriers on the first and second metal structures 710, 711 may be excited by the light, rendering the current flowing between the first and second metal structures 710, 711 through the tunnel region 73. Since the light incident from the back side to the tunnel region 73 of the light sensing transistor 7 may be effectively shielded by the gate structure 74, a signal to noise ratio of the light sensing transistor 7 may be effectively enhanced. Thus, by disposing the gate structure 74 on the back side of the light sensing transistor 7, the light sensing transistor 7 may effectively avoid noise aroused by the incident light from the back side to the tunnel region 73 of the light sensing transistor 7.

Figure 8:
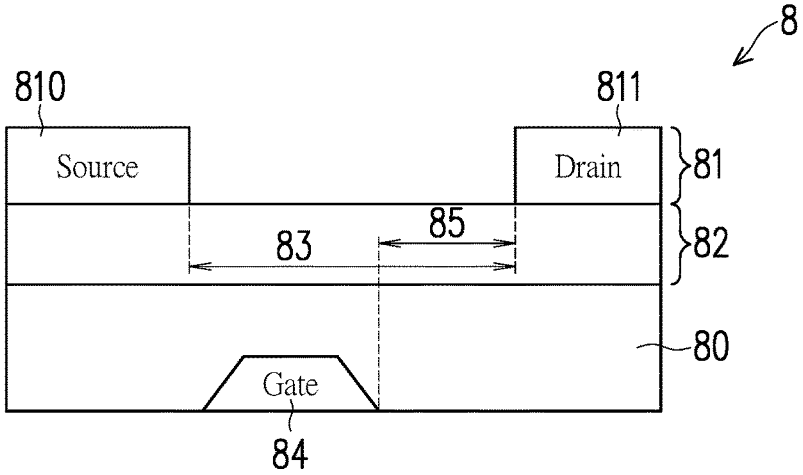
FIG. 8 illustrates a cross-sectional view of a light sensing transistor in accordance with some embodiments.

FIG. 8 illustrates a cross-sectional view of a light sensing transistor 8 in accordance with some embodiments. The light sensing transistor 8 may be a thin film transistor (TFT). The light sensing transistor 8 includes a substrate 80, a metal layer 81, a semiconductor layer 82, and a gate structure 84. The substrate 80 is disposed on the gate structure 84. The semiconductor layer 82 is disposed on the substrate 80. The gate structure 84 and the semiconductor layer 82 are disposed on opposite sides of the substrate 80. The metal layer 81 is disposed on the semiconductor layer 82. The metal layer 81 includes a first metal structure 810 and a second metal structure 811. The first metal structure 810 and the second metal structure 811 are in direct contact with the semiconductor layer 82. More specifically, the metal layer 81 are in direct contact with the semiconductor layer 82 without an intermediating n-plus layer, such that the light sensing transistor 8 may achieve a better compatibility to different manufacturing processes. Further, the gate structure 84 is disposed on the back side for defining a gap region 85 between the gate structure 84 and the second metal structure 811 in a vertical projection direction. The gap region 85 makes the light sensing transistor 8 as a gap-type light sensing transistor 8, which usually includes, but not limited to, one or more advantages of higher sensing current and better light sensitivity, or the like.

For example, the semiconductor layer 81 is deposited by a chemical vapor deposition (CVD) method, such as a plasma enhanced chemical vapor deposition (PECVD) method, a low pressure chemical vapor deposition (LPCVD) method and so on, but the examples of the chemical vapor deposition (CVD) method are not limited thereto. For example, an exemplary material of the semiconductor layer 82 comprises silicon nitride (SiNx), silicon oxide (SiOx), silicon oxynitride (SiNxOy) or other suitable materials. For example, materials of the first metal structure 810 and the second metal structure 811 include, but not limited to, molybdenum (Mo), or titanium (Ti) or other suitable materials.

Specifically, the semiconductor layer 82 is disposed on the substrate 80. The metal layer 81 is disposed on the semiconductor layer 82. The metal layer 81 includes the first metal structure 810 and the second metal structure 811 respectively disposed on both sides of the light sensing transistor 8. Particularly, there are no n-plus layer disposed between the metal layer 81 and the semiconductor layer 82, and thus the first metal structure 810 and the second metal structure 811 are in direct contact with the semiconductor layer 82.

The first metal structure 810 and the second metal structure 811 are spaced apart by a distance on the substrate 80, and a tunnel region 83 is defined by the first metal structure 810, 811 and formed by the semiconductor layer 82 between and under the first metal structure 810 and the second metal structure 811. The tunnel region 83 provides a current path between the first metal structure 810 and the second metal structure 811.

Further, the gate structure 84 is disposed under the substrate 80, and the metal layer 81 is disposed on the substrate 80, so that the gate structure 84 and the metal layer 81 are disposed on opposite sides of the substrate 80. The gate structure 84 may be disposed on the bottom side of the substrate 80 for shielding incident light from the back side of the light sensing transistor 8. In some aspect, the gate structure 84 may be coupled to receive a gate voltage, which may be further used for biasing the light sensing transistor 8. Specifically, the sensing current flowing through the light sensing transistor 8 may be biased by the gate voltage applied to the gate structure 84 at a relatively small range according to the applied gate voltage.

The gate structure 84 disposed under the substrate 80 further defines the gap region 85 within the tunnel region 83. Specifically, the gate structure 84 has a narrower width than that of the tunnel region 83. The gate structure 84 may be substantially aligned to or partially overlapped with a side wall of the first metal structure 810 in the vertical projection direction. Thus, the gate structure 84 covers one side of the tunnel region 43 while leaving another side of the tunnel region 83 exposed to the incident light from the back side of the light sensing transistor 8. The region exposed by the gate structure 84 and the second metal structure 811 within the tunnel region 83 is defined as the gap region 85. Therefore, the gate structure 84 may be utilized for shielding part of incident light from the back side to the tunnel region 83 of the light sensing transistor 8. In some embodiments, the gap-type light sensing transistor 8 is configured to sense the light from the top side of the light sensing transistor 8 with a higher sensing current and a better light sensitivity.

Further, as mentioned before, the phenomenon of LIBL is occurred between the junction interface between the semiconductor material and metal. Therefore, LIBL is also occurred on a junction interface between a side wall of the second metal structure 811 and the gap region 85. The barrier for carriers on the junction interface is accordingly lowered, thereby enhancing a light sensitivity of the gap-type light sensing transistor 8.

In operation, the first and second metal structures 810, 811 may respectively function as a source and drain terminals of a transistor while the gate structure 84 may function as a gate terminal. In some embodiments, the light sensing transistor 8 is configured to sense the light from the back side of the light sensing transistor 8. When a light is emitted from a top side to the light sensing transistor 8, carriers on the first and second metal structures 810, 811 may be excited by the light, rendering the current flowing between the first and second metal structures 810, 811 through the tunnel region 83.

In summary, the light sensing transistor includes the metal structures directly in contact with the metal layer, such that LIBL may be occurred on the junction interface between each of the metal structure and the semiconductor layer. LIBL causes more carriers to be activated when light is emitted on the junction interface, thereby enhancing light sensitivity of the light transistor. In addition, without the step of disposing the n-plus material in the light sensing transistor, the light sensing transistor is capable to be manufactured by the manufacturing process of LTPS. Thus, the proposed light sensing transistor has a better compatibility to different of manufacturing processes, and a better ease to be integrated into other devices.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light sensing transistor, comprising:

a substrate;

a metal layer, having a first metal structure and a second metal structure, wherein the metal layer includes titanium or molybdenum;

a semiconductor layer disposed on the metal layer, wherein a material of the semiconductor layer includes silicon nitride (SiNx), silicon oxide (SiOx), or silicon oxynitride (SiNxOy);

a tunnel region between the first metal structure and the second metal structure, and a sensing current is conducted between the first metal structure and the second metal structure when a light is emitted to the light sensing transistor; and a gate structure disposed under the substrate, the gate structure overlapping with the tunnel region in a vertical projection direction, wherein both of the first metal structure and the second metal structure are in direct contact with the semiconductor layer, so that light induced barrier lowering (LIBL) is formed on a junction interface between the metal layer and the semiconductor layer.

2. The light sensing transistor of claim 1, wherein a first surface is between the substrate and the metal layer and a second surface is between the metal layer and the semiconductor layer, and the first metal structure and the second metal structure are in direct contact with the semiconductor layer on the second surface.

3. The light sensing transistor of claim 1, wherein the sensing current is caused by the light emitted to the light sensing transistor from a top side.

4. The light sensing transistor of claim 1, wherein the gate structure shields at least part of a light emitted to the tunnel region of the light sensing transistor from a back side.

5. The light sensing transistor of claim 1, further comprising a gap region between the gate structure and the second metal structure in the vertical projection direction.

6. A light sensing transistor, comprising:

a substrate;

a semiconductor layer disposed on the substrate, wherein a material of the semiconductor layer includes silicon nitride (SiNx), silicon oxide (SiOx), or silicon oxynitride (SiNxOy);

a metal layer disposed on the semiconductor layer, the metal layer having a first metal structure and a second metal structure, wherein the metal layer includes titanium or molybdenum;

a tunnel region between the first metal structure and the second metal structure, and a sensing current is conducted between the first metal structure and the second metal structure when a light is emitted to the light sensing transistor; and a gate structure disposed under the substrate, the gate structure overlapping with the tunnel region in a vertical projection direction;

wherein both of the first metal structure and the second metal structure are in direct contact with the semiconductor layer, so that light induced barrier lowering (LIBL) is formed on a junction interface between the metal layer and the semiconductor layer.

7. The light sensing transistor of claim 6, wherein the sensing current is caused by the light emitted to the light sensing transistor from a back side.

8. The light sensing transistor of claim 6, wherein the gate structure shields at least part of the light emitted to the tunnel region of the light sensing transistor from the back side.

9. The light sensing transistor of claim 6, further comprising a gap region between the gate structure and the second metal structure in the vertical projection direction.

* * * * *